United States Patent
Hartmann et al.

(12)

(10) Patent No.: US 6,858,447 B2
(45) Date of Patent: Feb. 22, 2005

(54) METHOD FOR TESTING SEMICONDUCTOR CHIPS

(75) Inventors: Udo Hartmann, München (DE); Jochen Kallscheuer, München (DE); Peter Beer, Tutzing (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/151,990

(22) Filed: May 21, 2002

(65) Prior Publication Data

US 2003/0059962 A1 Mar. 27, 2003

(30) Foreign Application Priority Data

May 21, 2001 (DE) .......................... 101 24 735

(51) Int. Cl.[7] .................. H01L 21/66; G06F 17/50; G01R 31/28
(52) U.S. Cl. .................. 438/14; 438/149; 438/199; 438/200; 438/201; 438/15; 438/286; 438/290; 716/4; 714/718; 714/719; 714/721; 714/724; 714/733; 714/734; 714/735
(58) Field of Search .......................... 438/14, 149, 199, 438/286, 200, 201, 239, 290, 15; 716/4; 714/724, 720, 819, 733, 734, 735, 719, 718, 703

(56) References Cited

U.S. PATENT DOCUMENTS

| 4,970,727 | A | | 11/1990 | Miyawaki et al. | |
|---|---|---|---|---|---|
| 5,202,888 | A | | 4/1993 | Ochiai | 714/719 |
| 5,644,699 | A | * | 7/1997 | Yoshida | 714/7 |
| 6,233,182 | B1 | * | 5/2001 | Satou et al. | 365/200 |
| 6,259,639 | B1 | * | 7/2001 | Hashizume | 365/201 |
| 6,314,011 | B1 | * | 11/2001 | Keeth et al. | 365/51 |
| 6,557,128 | B1 | * | 4/2003 | Turnquist | 714/724 |

FOREIGN PATENT DOCUMENTS

EP  0 786 675 A2  4/1997

* cited by examiner

Primary Examiner—Matthew Smith
Assistant Examiner—Igwe U. Anya
(74) Attorney, Agent, or Firm—Laurence A. Greenberg; Werner H. Stemer; Ralph E. Locher

(57) ABSTRACT

A method for testing semiconductor chips, in particular semiconductor memory chips, is described. In which, in a chip to be tested, at least one test mode is set, the test mode is executed in the chip and test results are output from the chip. It is provided that, after the setting and before the performance of the test mode, a check mode is executed in which the status of the test mode set in the chip is read out in a defined format.

7 Claims, No Drawings

METHOD FOR TESTING SEMICONDUCTOR CHIPS

BACKGROUND OF THE INVENTION

Field of the Invention

The present invention relates to a method for testing semiconductor chips, in particular semiconductor memory chips, in which, in a chip to be tested, at least one test mode is set, the test mode is executed in the chip and test results are output from the chip.

Semiconductor chips are already subjected to tests and repair processes (debugging) at the wafer level in order to determine the quality of the chips and in order to reject or repair chips, if appropriate, before further production. Corresponding chip tests are effected simultaneously or in parallel on a large number of chips with the aid of test units which generally provide a multiplicity of test modes which are loaded into the chips to be tested or are set therein, whereupon the respective test mode is executed in the chip, the test results obtained in the process being output from the chip to the test unit. The sequence of the test method assumes that the test modes set in the chip and, if appropriate, the associated registers have actually been set and have initiated the desired test sequences. In other words, a check to determine whether the test modes have actually been successfully initiated can only be performed on the basis of derived reactions of the chip. The checks are effected manually, which is associated with a corresponding outlay in respect of time and costs, especially as nowadays the test modes are becoming ever more extensive and complex. What is also problematic in the case of manual checking, however, is that derived reactions cannot readily be assigned to a specific functional area of the chip. By way of example, if an internal counter of the chip does not run correctly, then this can be comprehended only with very great difficulty from the derived reactions usually with the aid of additional physical analyses. Furthermore, it is problematic in this connection if a plurality of test modes are combined with one another for the development of test procedures. In this case, if even just one test mode is forgotten or sent incorrectly, the defect present on the chip cannot be inferred directly from the reaction of the chip to the set test modes, but rather only indirectly and in a manner which takes a very long time.

The test method for semiconductor chips as mentioned in the introduction thus has the disadvantage that reliable test results can be obtained only with a very high outlay and in some instances not at all.

U.S. Pat. No. 4,970,727 discloses a method for testing semiconductor chips, in particular semiconductor memory chips, in which, in a chip to be tested, at least one test mode is set, the test mode is executed in the chip and the test results are output from the chip. This document describes an integrated semiconductor memory that can carry out a plurality of test modes that can be chosen via an external tester. To that end, the signals applied to the terminals of the integrated semiconductor memory by the external tester are loaded via an input and output buffer and a circuit into a register and stored there, so that the selected test mode remains defined even if the signals at the terminals of the semiconductor memory change. Afterward, the datum stored in the register is decoded in a decoder that outputs a signal corresponding to the test mode to a control circuit, which thereupon initiates the execution of the test mode. During the execution of the test mode, in the case of the semiconductor memory, the latter can be actuated by the register being read via the circuit and the input and output buffer and the terminals by the external tester.

SUMMARY OF THE INVENTION

It is accordingly an object of the invention to provide a method for testing semiconductor chips which overcomes the above-mentioned disadvantages of the prior art methods of this general type, which always yields reliable and comprehensible test results.

With the foregoing and other objects in view there is provided, in accordance with the invention, a method for testing semiconductor chips, in particular memory chips. The method includes the steps of setting at least one test mode in a chip to be tested, executing a check mode by reading out in a defined format a status of the test mode set in the chip, executing the test mode in the chip, and outputting test results from the chip.

Instead of the previous control of the test method for semiconductor chips, which is carried out flying blind, as it were, because the quality of the test can only be inferred via the derived reactions, the invention provides monitoring of the status of the test modes before the internal execution of the test in the respective semiconductor chip. The approach according to the invention thus provides monitoring in the course of the test method, which reveals whether the test modes have actually been loaded completely and correctly into the chip, so that there is already certainty with regard to correct initiation of the test before the execution of the test sequence and thus before the test results are obtained. Thus, with the aid of the method according to the invention, the chips in which the test modes have not been set correctly can already be withdrawn from circulation or repaired at an early stage, or the conditions for setting the test modes can be checked and redefined at an early stage.

The method according to the invention accordingly has the advantage of saving time and increasing quality in the verification of new chip configurations and in the development and debugging of test sequences.

In the case where the method for testing semiconductor chips provides for at least one register in the chip also to be set together with the respective check mode, it is preferably provided that the status of the set register is likewise read out in the check mode that is additionally provided according to the invention.

In the case where a plurality of test modes and, if appropriate, a plurality of registers are set in the chip to be tested, to save time provision is made for reading out the status of only predetermined test modes and, if appropriate, registers in the check mode. This is done in the case where not all the information of the test is relevant.

The defined output format of the check mode preferably contains a stipulated start signature and a stipulated stop signature. This serves for easy identifiability of shifted data strings.

In principle, the method according to the invention is also suitable for testing productive parameters, such as, for instance, the frequency of a self-refresh oscillator of DRAMs.

In order to simplify the test mode, it is preferably provided that comparison values that are prescribed for the status read-out of the registers are input into the chip. The comparison values are compared with the register values internal within the chip, and the comparison result is read out in the check mode with a pass/fail topology. The PASS/FAIL topology can be configured arbitrarily and preferably has the form of 1/0.

To summarize, it is to be emphasized that the method according to the invention affords the possibility of interrogating the status of a semiconductor chip to be tested with regard to all the test modes and registers before the actual test is allowed to proceed in the chip.

Other features which are considered as characteristic for the invention are set forth in the appended claims.

Although the invention is described herein as embodied in a method for testing semiconductor chips, it is nevertheless not intended to be limited to the details described, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments.

DESCRIPTION OF THE PREFERRED EMBODIMENTS

An inventive method for testing semiconductor chips is now explained in more detail. In tabular form, a definition, execution and evaluation of a test mode according to the invention in the context of a test method for semiconductor chips, are now described.

Accordingly, 30 test modes TM0–29 are defined for a semiconductor chip, namely a semiconductor memory in the form of an SRAM. Of the 30 test modes, the test mode TM28 has three registers each having four places, while the test mode TM29 has seven registers each having six places.

For a so-called productive test in which a self-timer refresh of the DRAM is tested, there is the following read-out possibility: 8 digits → STR.

| $X_1$ | $X_2$ | $X_3$ | $X_4$ | Switched on |
|---|---|---|---|---|
| 1 | | | | TM0–29 |
| | 1 | | | REG0–2 |
| | | 1 | | REG3–9 |
| | | | 1 | STR |

Output format:
Start signature: 1111111111110001
Stop signature: 1000111111111111
Format: <Start signature><TM0> . . . <TM29><REG0> . . . <REG9><STR><Stop signature>

For the execution of the test, it is declared that only the test modes 0, 5, 6, 7, 23, 29 are active. For the interrogation of the chip status in the check mode, the chip response shown in the drawing must be verified.

Execution

The TMs 0, 5, 6, 7, 23 and 29 are now active

Call: TMR0<1111>{fall test modes and registers are read}
Chip response: {the blanks serve only for better legibility}

```
1111111111110001      10000111000000000000001000001       000000000000
| start signature |   t  t  t                     t             t    | r  r  r
|                 |   m  m  m                     m             m    | e  e  e
|                 |   0  2  4                     2             2    | g  g  g
|                 |                                             3    9    | 0  1  2
|                 |
101111000001000000
r      r      r
e      e      e
g      g      g
3      4      5
110011000101111000010101                   01010101       1000111111111111
r     r     r     r       |    STR       |    stop signature    |
e     e     e     e       |              |                      |
g     g     g     g       |              |                      |
6     7     8     9       |              |                      |
```

A check mode is provided according to the invention and is designated as a TM-Read-OUT test mode in the drawing and is called as follows: → TMRO <$x_1x_2x_3x_4$>, where a switch-on masking <0 or 1>that is entered in the drawing and the definition is declared for $x_1x_2x_3x_4$.

A start signature and a stop signature with a stipulated sequence of ones and zeros are defined as an input format and what is defined as the format is that the start signature is followed by the 30 test modes, followed by the registers and STR and also the stop signature.

Definition

Chip with 30 test modes → TM0–29 the TM28 has 3 registers each having 4 digits → REG0–2 the TM29 has 7 registers each having 6 digits → REG3–9

Read-out possibility for a productive test e.g. self timer refresh 8 digits → STR Call of the TM-READ-OUT test mode → TMRO<$x_1x_2x_3x_4$>where for $x_1x_2x_3x_4$ the following switch-on masking <0 or 1>is declared:

The subsequent evaluation of the read-out status reveals which test modes are active, which registers do not have to be taken into account, the contents of the registers to be taken into account, and the content of STR.

If the evaluation has revealed, as in the present case, that all the test modes and registers have been set correctly, the test method according to the invention is continued with the actual test sequence and the outputting of the test results.

Evaluation

It can be read from the data string that:
TM0, 5, 6, 7, 23 and 29 are active
REG0–2 are don't care since the TM28 is off
REG3: 101111
REG4: 000001
REG5: 000000
REG6: 110011
REG7: 000101
REG8: 111000
REG9: 010101
STR: 01010101

We claim:
1. A method for testing semiconductor chips, which comprises the steps of:
setting at least one test mode in a chip to be tested;
executing a check mode by reading out in a defined format a status of the test mode set in the chip;

after performing the step of executing the check mode, executing the test mode in the chip; and outputting test results from the chip.

2. The method according to claim 1, which comprises:

setting at least one register in the chip resulting in a set register; and reading out a status of the set register during the check mode.

3. The method according to claim 1, which comprises:

setting a plurality of test modes and plurality of registers; and reading out a status of only selected test modes and selected registers during the check mode.

4. The method according to claim 3, which comprises:

inputting comparison values prescribed for the status read-out of the registers into the chip;

comparing the comparison values with register values internally within the chip; and reading out a comparison result during the check mode with a pass/fail topology.

5. The method according to claim 1, which comprises providing the defined format in the check mode with a start signature and a stop signature.

6. The method according to claim 1, which comprises debugging the chip.

7. The method according to claim 1, which comprises using a semiconductor memory chip as the chip being test.

* * * * *